US007586752B2

(12) United States Patent
Fernandez et al.

(10) Patent No.: US 7,586,752 B2
(45) Date of Patent: Sep. 8, 2009

(54) TUBULAR TELECOM CABINETS

(75) Inventors: Pedro A. Fernandez, Liberty Lake, WA (US); Lloyd W. Lohf, Liberty Lake, WA (US)

(73) Assignee: Telect Inc., Liberty Lake, WA (US)

( * ) Notice: Subject to any disclaimer, the term of this patent is extended or adjusted under 35 U.S.C. 154(b) by 514 days.

(21) Appl. No.: 11/276,474

(22) Filed: Mar. 1, 2006

(65) Prior Publication Data

US 2007/0206362 A1 Sep. 6, 2007

(51) Int. Cl.
*H05K 5/00* (2006.01)
*H05K 5/04* (2006.01)
*H05K 5/06* (2006.01)
(52) U.S. Cl. .................... 361/752; 361/730; 361/753
(58) Field of Classification Search .......... 361/730–753
See application file for complete search history.

(56) References Cited

U.S. PATENT DOCUMENTS 5,863,083 A * 1/1999 Giebel et al. ................. 294/1.1
6,118,662 A * 9/2000 Hutchison et al. ............ 361/704
6,517,122 B1 * 2/2003 Minemyer ................... 285/328

* cited by examiner

*Primary Examiner*—Tuan T Dinh
(74) *Attorney, Agent, or Firm*—Lee & Hayes, PLLC

(57) ABSTRACT

Embodiments of tubular telecommunications cabinets are presented herein. Specifically, Telecommunications equipment cabinets are described which are configured to protect a plurality of components from environmental influences and provide a high degree of access to the interior of the cabinet. In an implementation a cabinet is configured with a plurality of mountings to mount a plurality of telecommunications equipment within a tubular enclosure. A plurality of partially-tubular sides may be joined to form the tubular enclosure around the mountings. Thus, equipment may be mounted within the cabinet to protect the equipment, for instance, at an outside location. The sides further are operable to permit access to the interior and corresponding equipment around substantially the entire perimeter of the cabinet.

7 Claims, 6 Drawing Sheets

500

502
Form a Structure for a Cabinet having a Plurality of Equipment Mountings for Telecommunication Equipment

504
Attach a Pair of Semi-Tubular Sides to the Structure which are Operable to Form a Tubular Enclosure Around the Equipment Mountings

600 →

602
Mount a Plurality of Telecommunication Equipment within a Cylindrical Cabinet

↓

604
Operate Pair of Semi-Cylindrical Doors to Provide Access to the Equipment from Substantially the Entire Perimeter of the Cabinet

*Fig. 6*

TUBULAR TELECOM CABINETS

FIELD OF THE INVENTION

The present disclosure relates to equipment cabinets for mounting telecommunications equipment. More specifically, the disclosure relates to tubular telecommunications equipment cabinets.

BACKGROUND

Equipment within a telecommunications infrastructure may be maintained in variety of equipment housings. Both indoor and outdoor equipment enclosures are designed to protect equipment from environmental influences (e.g., heat, cold, water, dust). Traditionally, equipment housings designed to protect equipment from the elementals have constricted access to the interior, such as via doors or panels on a single side of a cabinet. In this manner, the areas where the elements may penetrate the cabinet are kept to a minimum and therefore protection of the equipment inside (e.g., sealing the cabinet) may be simpler. However, a side effect of minimizing access is that mounting and maintaining equipment within the cabinet becomes more complicated. Often, new and different arrangements of telecommunications equipment are required for a variety of reasons such as to handle increased demands for service, due to technology changes, to accommodate new or different equipment and so forth. Also, access to equipment may be required for maintenance or repairs. However, it may be difficult to update, maintain, or repair equipment mounted within a traditional cabinets using traditional techniques to provide protection from the elements. For instance, a technician may need to remove the equipment or disassemble the cabinet to provide the necessary access. Accordingly, accessing equipment in traditional cabinets may be difficult, time consuming and costly.

SUMMARY

Telecommunications equipment cabinets are described which are configured to protect a plurality of components from environmental influences and provide a high degree of access to the interior of the cabinet. In an implementation a cabinet is configured with a plurality of mountings to mount a plurality of telecommunications equipment within a tubular enclosure. A plurality of partially-tubular sides may be joined to form the tubular enclosure around the mountings. Thus, equipment may be mounted within the cabinet to protect the equipment, for instance, at an outside location. The sides further are operable to permit access to the interior and corresponding equipment around substantially the entire perimeter of the cabinet.

BRIEF DESCRIPTION OF THE DRAWINGS

FIG. 6 is a flow diagram depicting a procedure in an exemplary implementation in which telecommunication equipment is accessed via a cylindrical cabinet having semi-cylindrical doors.

DETAILED DESCRIPTION

It should be noted that the following devices are examples and may be further modified, combined and separated without departing from the spirit and scope thereof.

Figure 1:
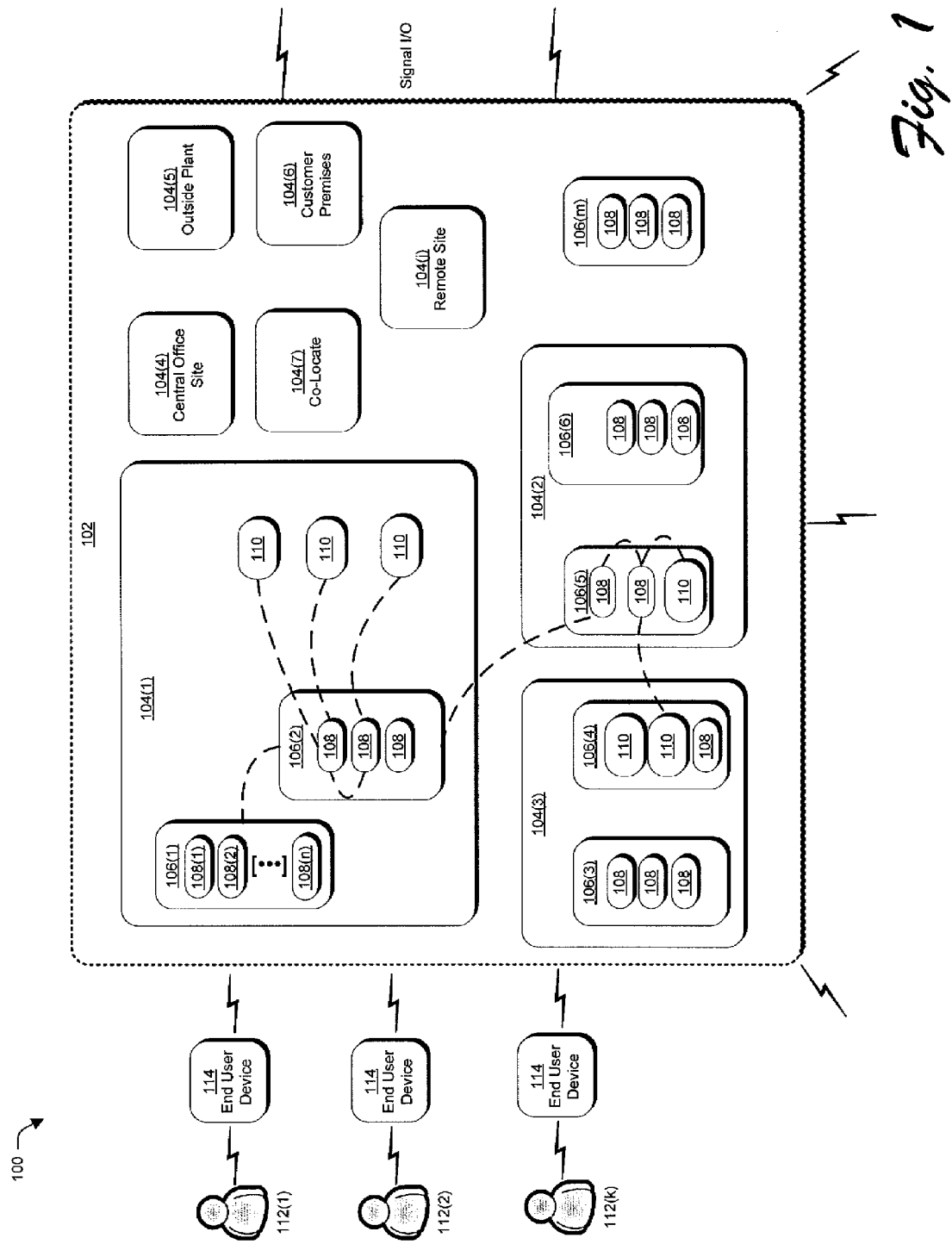
FIG. 1 is an illustration of an environment having a portion of a telecommunications infrastructure in which telecommunications equipment cabinets may be employed.

FIG. 1 illustrates an exemplary implementation of an environment 100 operable to provide a telecommunications network in which the apparatuses and procedures of the present disclosure may be employed. The environment 100 includes at least a portion of a telecommunication network infrastructure 102 (hereinafter "infrastructure"). Infrastructure 102 provides telecommunications processes, structures, equipment and devices between end-user devices such as modems, phones, and so on used by end-users outside of the infrastructure 102 to communicate via a telecommunications network. Within infrastructure 102 a variety of equipment, apparatus and devices are utilized in routing, processing, and distributing signals. Telecommunications signals and data may among other actions be processed, switched, routed, tested, patched, managed, or distributed by various equipment in the infrastructure 102.

A variety of sites 104(1)-104(j) within infrastructure 102 may maintain various equipment used in the infrastructure 102, where "j" may be any integer from one to "J". As depicted in FIG. 1, infrastructure 102 may have numerous sites 104 which may be different physical locations within infrastructure 102 such as a central office, an outside plant site, a co-locate site, a remote site, or customer premises. Sites 104 may be locations within infrastructure 100 which hold a variety of structures and equipment to facilitate processing and distributing of telecommunications signals. The equipment may be centralized in one site (e.g., site 104(1)) or dispersed throughout different sites 104 in infrastructure 102. In other words, interconnections may be made between various sites 104 in infrastructure 102, for example the connection denoted in FIG. 1 by a dashed line between site 104(1) and 104(2). Naturally, numerous interconnections between a plurality of sites 104 typically may be made.

Each site 104 may have one or more cabinets 106 having a plurality of components 108. A plurality of cabinets 106(1)-106(m) are depicted in FIG. 1, where "m" may be any integer from two to "M". A cabinet refers to a structure to maintain or hold a plurality of components 108 in infrastructure 102 and may be configured in a variety of ways. For example, the cabinet 106 may be configured a an enclosure for one or more terminal block, connection panel, a protector block, a chassis, a digital cross-connect, a switch, a hub, a rack, a frame, a bay, a module, an aisle, or other structure for receiving and holding a plurality of components 108. Cabinets 106 may be inside a building or housings may themselves be configured to be placed outside, e.g. an outside plant cabinet. Cabinets 106 may typically be configured to protect components 108 from environmental influences. The environment 100 of FIG. 1, for instance, depicts site 104(1) as having two cabinets 106, each having a plurality of components 108. Other cabinets 106 may be included throughout infrastructure 102 at sites 104, for example cabinets 106 depicted within site 104(2).

For instance, a cabinet 106 may be configured for application at an outside plant site such as site 104(5) depicted in FIG. 1. In other words, the cabinet 106 may be an outside plant cabinet. An outside plant cabinet, as the name suggests, is located outside and is configured to protect a plurality of components 108, from environmental influences (e.g., heat, cold, wind, rain and so forth). It is contemplated that the devices and techniques described herein may be employed with various cabinets 106(1)-106(m) configured for indoor and outdoor applications alike.

One or more of cabinets 106(1)-106(m) configured to protect a plurality of components 108 from environmental influences may provide a high degree of access to the interior. For instance, a cabinet 106 may be configured as tubular cabinet (e.g., a tubular enclosure) employing partially-tubular (e.g., semi-tubular) sides operable to permit access to the interior and equipment around substantially the entire perimeter of the cabinet. Further discussion of cabinets configured as tubular enclosures may be found in relation to FIG. 2-6.

Components 108 are pieces of telecommunications equipment in infrastructure 102 that may be kept or maintained in a housing 106 (e.g., a cabinet) within the infrastructure 102. Components for example may be cross-connect panels, modules, terminal blocks, protector blocks, chassis, backplanes, switches, digital radios, repeaters and so forth. Generally, components 108 may be those devices utilized for processing and distributing signals in infrastructure 102 and which may be maintained in a housing 104. Components 108 may also be used to manage cabling in infrastructure 102. Components 108 may terminate, interconnect or cross-connect a plurality of network elements 110 within infrastructure 102. Components 108 may be utilized to distribute telecommunications signals sent to and from infrastructure 102 by one or more end-users 112 using an end-user device 114. The interconnections between telecommunications equipment (e.g., cabinets 106, components 108 and network elements 110) provide signal pathways for telecommunications signals. Interconnection may be via one or more components 108 such as by connectors disposed on a component, such as a protector block, or may be internal to the components 108 such as via cabling within a component 108. Representative interconnections are shown by dashed lines in FIG. 1 and numerous interconnections within and between telecommunication equipment are typical.

Network elements 110 may be implemented in a variety of ways. For example, network elements 110 may be configured as switches, digital cross connect system (DCS), telecommunication panels, terminal blocks, protector blocks, digital radios, fiber optic equipment, network office terminating equipment, and any other telecommunication equipment or devices employed in a telecommunications infrastructure 102. It is noted that one or more of the components 108 within a cabinet 106 may also be a network element 110. In other words, network elements 110 may be found within a cabinet 106 as component 108 of the cabinet. Thus, in a particular cabinet 106 interconnections may be between network elements 110 externally (e.g., not in the same cabinet) or internally (e.g., within the same cabinet). Naturally, internal and external interconnections may be mixed such that a single cabinet 106 will have both internal and external interconnections. Further, such connections for a particular cabinet 106 might be made wholly within a particular site 104. Interconnections may also be made between a plurality of sites 104 (1)-104(j).

In an implementation, a cabinet 106 has a plurality of components 108 to connect numerous lines. A cabinet 106 may have a plurality of components 108 as depicted in FIG. 1 by 108(1), 108(2), . . . , 108(n), where "-n" may be any integer from one to "N". Components 108(1)-108(n) generally provide modular connection points within a cabinet 106 between various network elements 110 such as switches, cross-connects, terminal blocks, protector blocks and so forth. End-users 112 may be connected via twisted pair cabling to protector blocks 108(1)-108(n) in a cabinet 106 located within infrastructure 102. Further, end-users 112 may be connected via a plurality of network elements 110 which are connected via the various equipment in infrastructure 102, including the interconnections of a plurality of protector blocks such as protector blocks 108(1)-108(n). For example, an end-user telephone call made between end user 112(1) and end user 112(2) may be routed using one or more protector blocks 108(1)-108(n) and/or various network elements 110 within infrastructure 102.

The environment 100 depicts a plurality of end users 112 (1)-112(k), where "k" may be any integer from one to "K". End users 112(1)-112(k) may be communicatively coupled, one to another, via a telecommunication network including infrastructure 102. End users 112 may be implemented in a wide variety of ways, such as consumers, business users, internal users in a private network, and other types of users that use telecommunications signals or transmit and receive telecommunications signals. Additionally, for purposes of the following discussion clients 112(1)-112(k) may also refer to client devices and software which are operable to transmit and receive telecommunications signals. Thus, clients 112 (1)-112(k) may be implemented as users, software and devices.

The interconnection of pieces of equipment (e.g. cabinets 106, components 108 and network elements 110, and so forth) provides signal pathways between equipment for signals input to and output from infrastructure 102. For example, end-users 112(1)-112(k) may send signals into the infrastructure 102 and receive signals output from the infrastructure using a variety of end user devices 114. For example, end user 112(2) may communicate with end user 112(k) via end-user device 114 (e.g., a telephone). Thus, signals sent to and from infrastructure by end-users 112 via an end user device 114, may be routed directed, processed, and distributed in a variety of ways via the equipment and interconnections within infrastructure 102.

Figure 2:
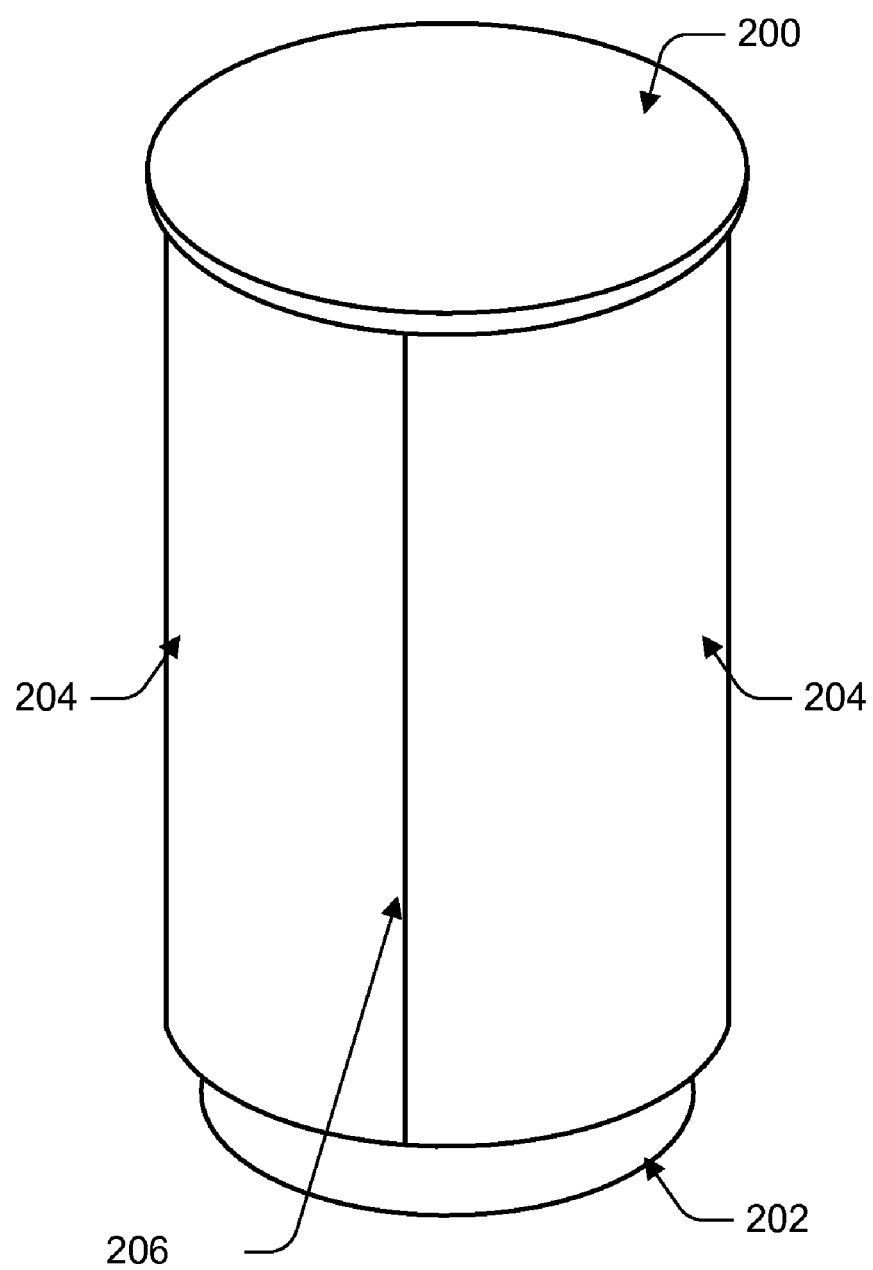
FIG. 2 is an illustration of an exemplary implementation of one or more of the cabinets of FIG. 1

FIG. 2 illustrates an exemplary implementation of one or more of the cabinets 106(1)-106(m) of FIG. 1. An exemplary cabinet 106(3) configured to hold a plurality of telecommunications components 108 is depicted. Generally, a cabinet 106 has a tubular shape such as a block, cube, cylinder and so forth. For example, cabinet 106(3) depicted in FIG. 2 is configured as a cylindrical tube. While exemplary cylindrical tube 106(3) is depicted in FIG. 2, a variety of tubular shaped cabinets are contemplated, such as triangular tube, rectangular tube, oval tube, and so on.

FIG. 2 depicts cabinet 106(3) having an exterior lid 200. Cabinet 106(3) further may be mounted upon as base portion 202. The lid 200 of FIG. 2 is depicted as generally circular. Naturally, the exterior lid 200 may be provided with a variety of different shapes. Typically, although not necessarily, the lid will be configured to match the tube shape, thus a cylindrical tube cabinet 106(3) may have a circular lid 200. In an implementation, the lid may overhang the body of the cabinet 106(3). This may provide overhead protection (e.g., from rain or sun) to a technician/user accessing the cabinet. For example, an overhanging rectangular lid 200 may be provided on a cylindrical cabinet. Similarly, base portion 202 may be configured in a variety of ways such as a rectangle, a circle, a triangle, a ring, and so forth.

Cabinet 106(3) further includes a plurality of sides 204. Sides 204 may be configured in a variety of ways to form a tubular enclosed portion of cabinet 106(3) and to permit access to the interior of cabinet 106(3). For example, a plurality of sides 204 may join along a common seam 206. In an implementation, one or more additional seams 206 exists along the perimeter of the cabinet (not shown) where two or more side portions 204 join to form the wall of the cabinet 106(3). Thus, a plurality of sides 204 may be joined along one or more seams 206. Joining the plurality of sides forms an interior chamber or enclosure. Thus, cabinet 106(3) has generally a tubular shape corresponding to the enclosure formed in part by joining a plurality of sides 204. Each side that forms the tubular enclosure is correspondingly partially-tubular, e.g., forms a portion of the tubular wall. Sides 204 are operable to permit access to the enclosed portion and accordingly to equipment maintained within the cabinet 106(3). For instance, sides 204 may be doors attached using hinges, sliding panels, removable panels and so forth.

For example, FIG. 2 depicts a pair of partially (e.g., semi-tubular) shaped sides 204. The pair of sides 204 is joined along the seam 206 to form a cylindrical enclosure of cabinet 106(3). The sides 204 may be joined at one or more seams 206 in a variety of ways such as interlocking, fasteners, pins, latches, clasps and so forth. It is also contemplated that a pair of sides 206 may have different size. For instance, rather than use matching sides, the partially-tubular sides 204 may be configured as a ¼ tube and a ¾ tube, a ⅓ tube and a ⅔ tube and so forth. Naturally, a plurality of sides 204 may include more than two sides, for example three partially-tubular sides 204 may be used, each of which surround approximately ⅓ of the tube. A variety of other exemplary arrangements for sides 204 may be found in the following discussion of further FIGS. 3-4.

Figure 3:
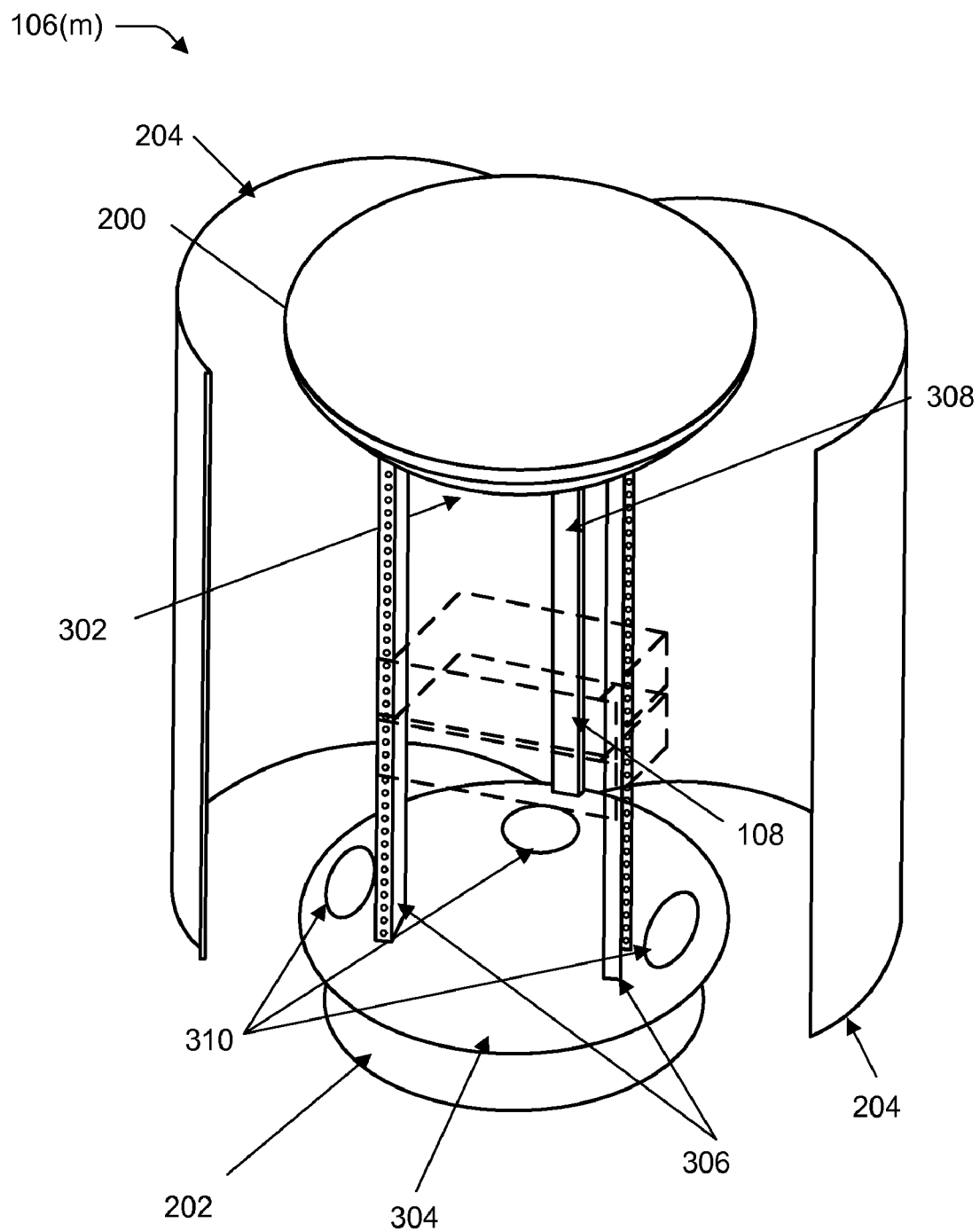
FIG. 3 is an illustration of an exemplary implementation of one or more equipment cabinet of FIG. 1 having semi-tubular doors shown partially open exposing the interior of the cabinet.

FIG. 3 depicts an exemplary implementation 300 of one more of cabinets 106(1)-106(m) of FIG. 1 having a pair of sides configured as semi-tubular doors and shown in an open position. In particular, FIG. 3 depicts a cabinet 106(m) having a pair of sides 204 configured as semi-cylindrical doors which may be closed (like a clamshell) to form a cylindrical tubular enclosure. In FIG. 3 the doors are depicted partially open revealing the interior of cabinet 106(m). The interior of cabinet 106(m) is depicted having an upper plate 302, a lower plate 304 and a plurality of structural supports 306 joining the plates. Upper plate 302 may be separate from or integrally formed to lid 200. Similarly, lower plate 304 may be separate from or integrally formed to base 202. Plates 302, 304 may be configured with a variety of shapes, thickness, materials, and so forth. Generally the characteristics of plates 302, 304 correspond to the particular tubular shape. For instance, the plates 302, 304 are depicted as generally circular in FIG. 3 and correspond to the semi-cylindrical sides 204.

In an implementation, plates 302, 304 provide a top and bottom, respectively, for the tubular enclosure of cabinet 106(m). In an implementation, sides 204 are configured to fit closely around the plates 302, 304 thereby forming the tubular enclosure. For instance, when sides 204 are configured as doors, the doors may be shut and joined (e.g., latched) along a seam 206 as described with respect to FIG. 2. Further, plates 302, 304 provide a location for a seal between sides 204 and the interior chamber of the tubular enclosure. Seals (e.g., gaskets, o-ring, sealing strips and so forth) may be provided on the sides 204 and/or plates 302, 304. Thus, a sealed tubular enclosure (e.g. an interior chamber of cabinet 106(m)) may be formed by to protect equipment within the cabinet 106(m) from environmental influences.

The plurality of structural supports 306 are disposed between the plates 302, 304 and provide the structural support for cabinet 106(3). The structural supports 306 may be joined together with the plates 302, 304 to form the framework for the cabinet 106(m), e.g., skeleton of the tubular enclosed portion. Structural supports 306 may be configured in a variety of ways such as posts, angled supports, beams and so forth.

Structural supports 306 further are configurable with a plurality of mountings for a variety of equipment. As previously described, a cabinet 106 may maintain or hold a plurality of components 108 in infrastructure 102. In this instance, the plurality of structural supports 306 of cabinet 106(m) provide a plurality of mountings for a variety of components 108. The plurality of mountings may configured in a variety of ways, including a variety of fasteners, mounting holes arranged in various patterns, different sized mounting holes, brackets and so forth. As an example, a plurality of telecommunications components 108 are depicted in phantom in FIG. 3 as mountable within cabinet 106(m) via the respective mountings of structural supports 306. Cabling may be routed in and out of the tubular enclosure to one or more side of the components 108 within the enclosure. For instance, cabling may be run through the bottom plate 304 of the cabinet 106(m), further discussion of which may be found below. Although components 108 mounted within cabinet 106(m) have been described, it should be appreciated that components 108 are representative of a variety of types of telecommunication equipment with which the cabinets and techniques of the present disclosure may be employed.

FIG. 3 further depicts a pivot 308 to which one or more sides 204 (e.g. doors) may be attached. In an implementation, at least one pivot 308 is disposed between and connects plates 302, 304. It is contemplated that one or more pivots may be utilized to arrange a plurality of sides 204 in a variety of ways, such as a plurality of sides on a common pivot, a plurality of pivots each attaching to at least one corresponding side 204, and so forth. A variety of side/door arrangements are contemplated further discussion of which may be found in relation to FIG. 4A-4B.

In addition to providing an attachment point for sides 204, one or more pivots 308 included with a cabinet 106(m) may be configured to provide structural support and mountings as described with respect to structural supports 306. Pivot 308 may be configured in a variety of ways, such as a spine, beam, post, bar and so forth. The edge surfaces of the pivot 308 provide a convenient location for a continuous seal.

For example, the pair of sides 204 in FIG. 3 is depicted as attached to a single common pivot 308 using hinges. Each side 204, for instance, may be attached to the pivot 308 via one or more hinges which are attached or integrally formed to the pivot 308. In operation, the sides 204 are hinged doors that independently open and close like a clamshell. Seals are provided along the pivot 308 and plates 302, 304. Seals further may be provided along the edges where the sides 204 meet, e.g., the seams 206 described in regard to FIG. 2. Thus, as the sides 204 close a cylindrical interior portion of cabinet 106(m) may be enclosed and/or sealed off. Accordingly, cabinet 106(m) is configured to provide protection from environmental influences to equipment mountable within the cabinet.

Further, the sides 204 (doors) may be swung open to provide a high amount of access to the interior of cabinet 106(m). For instance, the cylindrical cabinet 106(m) depicted in FIG. 3 provides nearly 360 degree access around the cabinet. Access may be provided from 270 degrees or greater up to 360 degrees around the cabinet. Clear access (e.g., access unobstructed by the cabinet, supports, doors and so forth) is provided around the entire perimeter of the cabinet, with the exception of the small portion where the pivot 308 is located. Thus, a technician working within the cabinet may easily update, maintain, and/or repair equipment and so forth. Using the devices and techniques described herein a cabinet 106(m) may be configured to provide clear access to the interior equipment from the perimeter of the cabinet 106(m), such as access to at least three sides of equipment within the cabinet without requiring any disassembly. Time, cost and complexity associated with set-up and upkeep of telecommunication equipment may all accordingly be reduced.

In an implementation, multiple and/or opposing sides of equipment are accessible by operating a single side 204. For example, one or more of the plurality of sides 204 may be configured to be movable (e.g., a hinged door, removable panel and so forth) and to independently provide access simultaneously to a first side of equipment and a second side of equipment opposite the first side. In other words, a single side 204 may be opened, removed and so forth to provide access to both the front and back sides of the cabinet 106(m) and correspondingly to equipment within the cabinet.

A plurality of areas 310 are depicted in FIG. 3 which may be used for variety of cabling and supporting equipment. Generally, areas 310 refer to the additional space within the cabinet outside of the footprint of mounted equipment (e.g., mounted to structural supports 306). For instance, equipment mounted within cabinet 106(m) of FIG. 3 will often (although not necessarily) be rectangular, such as components 108 depicted in phantom. Thus, in the depicted cylindrical implementation of cabinet 106(m) a plurality of areas 310 (e.g., secant areas) are formed around the rectangular footprint of the equipment, e.g., components 108.

In an implementation, one or more of areas 310 may be used for cable routing, for support equipment such as cooling fans and/or load centers and so forth. For instance, one or more area 310 on lower plate 304 may be configured with apertures which permit cabling to be run in and out of apertures, e.g. through the plate 304 and base 202. Thus, all the cabling for cabinet 106(m) is routed in and out the bottom portion of the cabinet 106(m). Utilizing the areas 310 as described for cable runs and/or additional support equipment preserves the space efficiency, by maximizing the amount of utilized space.

Figure 4B:
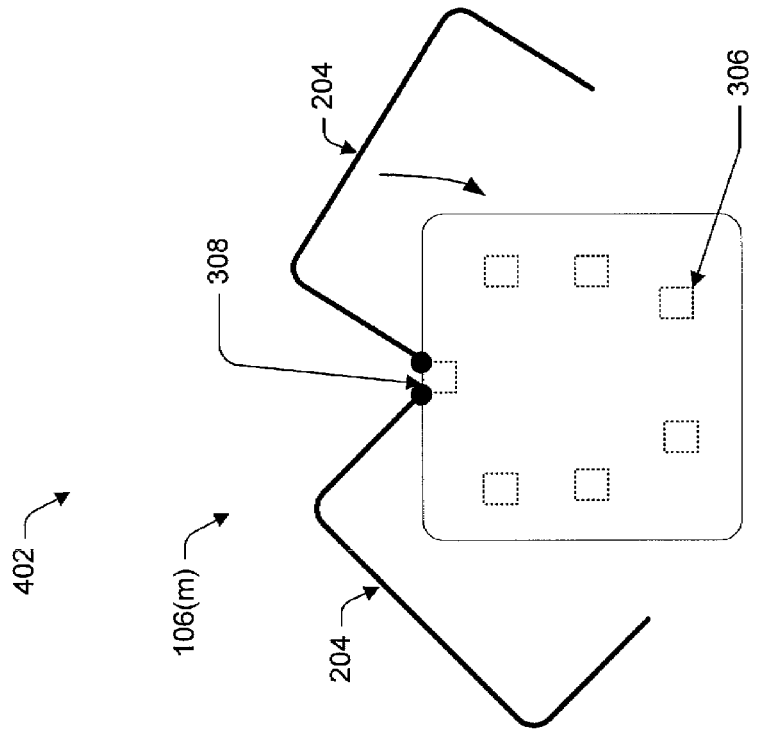
FIG. 4B is a schematic overhead illustration of a cabinet of FIG. 3 in an exemplary implementation in which the cabinet is configured as a rectangular tube and has a plurality of doors mounted on a common pivots.
Figure 4A:
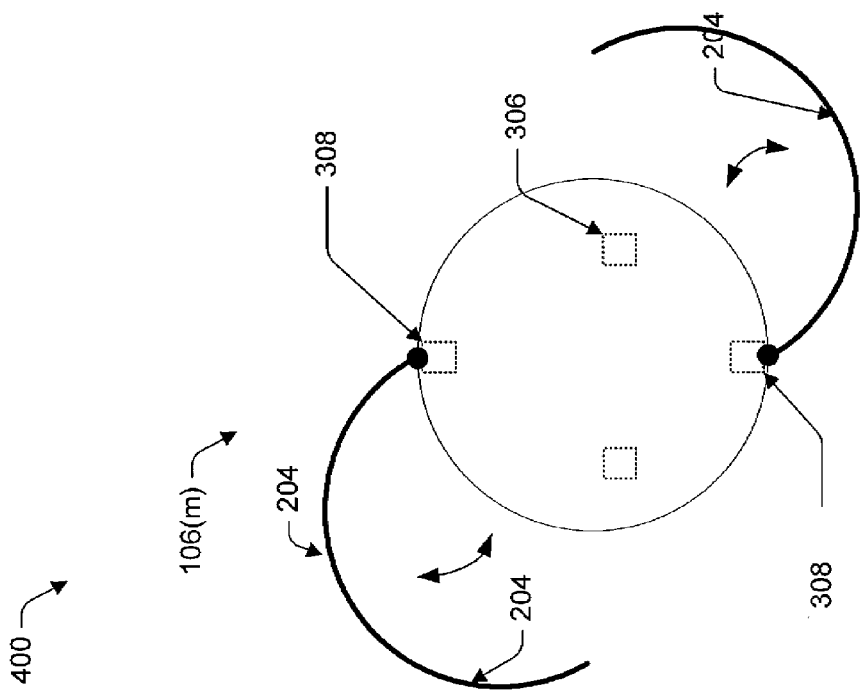
FIG. 4A is a schematic overhead illustration of a cabinet of FIG. 3 in an exemplary implementation in which the cabinet is configured as a cylindrical tube and has a plurality of doors mounted on opposing pivot.

FIG. 4A depicts schematic overhead view of an exemplary implementation 400 of cabinet 106(m) depicted in FIG. 3 wherein sides 204 are arranged on opposing pivots. A plurality of pivots 308 is depicted each having a corresponding side 204 configured as semi-cylindrical door hingedly attached to the respective pivot. In this case, the pivots are located opposite one another on the perimeter of the cabinet 106(m) which is configured as a cylindrical tube. The pair of sides 204 swing open from their respective pivots 308 to provide access around the perimeter of the cabinet 106(m). Further, sides 204 may be closed and latched to form a tubular enclosure, in this instance a cylindrical tube. Also in this instance, each side 204 is hingedly attached to one pivot 308 and is configured to latch at the opposite pivot 308.

FIG. 4B depicts schematic overhead view of another implementation 402 of a cabinet 106(m) configured as a rectangular tube. FIG. 4B further depicts sides 204 as u-shaped semi-tubular doors. Doors (e.g., sides 204) are hingedly attached to a common pivot 308. A plurality of structural supports 306 is shown which may provide a variety of mounting positions for telecommunication equipment. Further, sides 204 are operable to provide a high degree of access to the interior of the cabinet. For instance, equipment may be accessible from around nearly the entire rectangular perimeter of the cabinet 106. Naturally, while FIGS. 3 and 4A-4B depict doors hingedly attached, it is contemplated that alternative arrangements may employ sides 204 configured as removable panels, sliding doors, foldable doors, and so on.

Exemplary Procedures

The following discussion describes techniques that may be implemented utilizing the previously described systems and devices. The procedures are shown as a set of blocks that specify operations performed and are not necessarily limited to the orders shown for performing the operations by the respective blocks.

Figure 5:
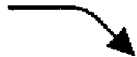
FIG. 5 is a flow diagram depicting a procedure in an exemplary implementation in a telecommunication cabinet having a tubular enclosure for mounting telecommunications equipment is formed.

FIG. 5 depicts a procedure 500 in an exemplary implementation in which a telecommunication cabinet having a tubular enclosure for equipment is formed. A structure is formed for a cabinet having a plurality of mountings for telecommunication equipment (block 502). For example, structural supports 306 may join a pair of plates 302, 304 as depicted in FIG. 3. As previously described, the structural supports may have a plurality of mountings, such as hole patterns disposed thereon. Thus, a structure which is generally the skeleton of tubular enclosure as depicted in FIG. 2 may be formed which is configured with a plurality of mountings for telecommunications equipment.

A pair of semi-tubular sides is attached to the structure which is operable to form a tubular enclosure around the equipment mountings (block 504). Again referring to FIG. 3, semi-cylindrical sides 204 may be attached to the previously described structure. For instance, sides 204 may be doors hingedly attached to a common pivot 308. Alternatively, sides 204 may be removable semi-tubular panels which are joined to one another along one or more seams 206 as depicted in FIG. 2. In another instance, removable semi-tubular panels may be joined one to the other along a seam 206 on one edge and latched to a common pivot 308 on another edge. In each case, the semi-tubular sides 204 join together to form a tubular enclosed area around the structural supports 306 depicted in FIG. 3 and accordingly around the associated equipment mountings.

FIG. 6 depicts a procedure 600 in an exemplary implementation in which a plurality of telecommunication equipment is accessed via a cylindrical cabinet having semi-cylindrical doors. A plurality of telecommunication equipment is mounted within a cylindrical cabinet (block 602). For example, a plurality of components 108 of FIG. 1 may be mounted within a cylindrical cabinet 106, such as cabinet 106(3) depicted in FIG. 2.

A pair of semi-cylindrical doors is operated to provide access to the equipment from substantially the entire perimeter of the cabinet (block 504). Referring to FIG. 3, doors (e.g. sides 204) are depicted providing access to the interior of an exemplary cabinet 106(m). A plurality of components 108 previously described may mounted within the cabinet. Doors may be hingedly attached to the cabinet 106(m) at a common pivot 308 as in FIG. 3, on a plurality of pivots 306 as in FIG. 4A and so on. Each door may be swung independently. Operating the doors (e.g., swinging opened and closed) permits access to the components 108 mounted within the cabinet. Further, a technician may have access to equipment around nearly the entire perimeter of the cabinet 106(m).

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An apparatus comprising:
   a tubular enclosure including a plurality of partially-tubular sides; and
   a plurality of mountings to hold a plurality of telecommunication equipment within the tubular enclosure;
   wherein:
   a cable is connectable on a first side of said equipment;
   at least one said partially-tubular side is movable to provide simultaneous access to the first side and a second side opposite to the first side;
   wherein the partially-tubular sides are configured as a pair of doors hinngedly fastened to a common pivot; and the doors are each movable to independently provide simultaneous access to said first side and to said second side of equipment while the equipment remains mounted;
   wherein the partially-tubular sides are movable to provide access to the interior substantially 360 degrees around the perimeter of the tubular enclosure.

2. The apparatus as described in claim 1, wherein the doors interlock along a single seam to seal the tubular enclosure.

3. The apparatus as described in claim 1, wherein the tubular enclosure is cylindrical.

4. The apparatus as described in claim 1, wherein the tubular enclosure is a rectangular tube.

5. An equipment cabinet comprising:
   a cylindrical enclosure;
   a plurality of mountings disposed within the cylindrical enclosure and configured to hold a plurality of telecommunication equipment in a telecommunication infrastructure;
   wherein the cylindrical enclosure is formed by joining a pair of semi-cylindrical side portions;
   wherein the semi-cylindrical side portions are doors, each hingedly attached to a respective pivot of the cabinet and operable to permit access to the interior of the cylindrical enclosure from substantially 360 degrees around the cabinet.

6. The equipment cabinet described in claim 5, wherein the cylindrical enclosure is sealable to protect a plurality of equipment from environmental influences at an outside plant location.

7. The equipment cabinet described in claim 5, wherein the plurality of mountings is arranged on a plurality of structural supports disposed within the cylindrical enclosure.

* * * * *